(12) United States Patent
Baez et al.

(10) Patent No.: US 7,176,731 B2
(45) Date of Patent: Feb. 13, 2007

(54) VARIATION TOLERANT CHARGE LEAKAGE CORRECTION CIRCUIT FOR PHASE LOCKED LOOPS

(75) Inventors: Franklin Manuel Baez, Ithaca, NY (US); David William Boerstler, Round Rock, TX (US); Eskinder Hailu, Austin, TX (US); Kazuhiko Miki, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 10/926,596

(22) Filed: Aug. 26, 2004

(65) Prior Publication Data

US 2006/0044030 A1 Mar. 2, 2006

(51) Int. Cl.
*H03L 7/06* (2006.01)

(52) U.S. Cl. .................................. 327/157; 327/148

(58) Field of Classification Search ............. 327/156, 327/157, 147, 148; 374/374
See application file for complete search history.

(56) References Cited

U.S. PATENT DOCUMENTS

| | | | | |
|---|---|---|---|---|
| 4,054,114 A * | 10/1977 | Saita | ............................ | 123/640 |
| 5,592,120 A * | 1/1997 | Palmer et al. | ............... | 327/536 |
| 5,740,213 A * | 4/1998 | Dreyer | ........................ | 375/374 |
| 6,169,458 B1 * | 1/2001 | Shenoy et al. | ................ | 331/17 |
| 6,172,571 B1 * | 1/2001 | Moyal et al. | ................. | 331/11 |
| 6,222,402 B1 * | 4/2001 | Boerstler et al. | ............ | 327/157 |
| 6,265,946 B1 * | 7/2001 | Bartlett | ........................ | 331/17 |
| 6,320,435 B1 * | 11/2001 | Tanimoto | .................... | 327/156 |
| 6,385,265 B1 * | 5/2002 | Duffy et al. | ................ | 375/374 |
| 6,535,051 B2 * | 3/2003 | Kim | ........................... | 327/536 |
| 6,768,359 B2 * | 7/2004 | Hsu | ............................ | 327/157 |
| 6,894,569 B2 * | 5/2005 | Fayneh et al. | ................ | 331/16 |
| 6,898,339 B2 * | 5/2005 | Shah et al. | .................... | 385/13 |
| 6,900,677 B2 * | 5/2005 | Cho | ............................ | 327/157 |
| 6,972,604 B2 * | 12/2005 | Boerstler et al. | ............ | 327/156 |

\* cited by examiner

*Primary Examiner*—Timothy P. Callahan
*Assistant Examiner*—Hai L. Nguyen
(74) *Attorney, Agent, or Firm*—Carr LLP; Diana R. Gerhardt

(57) ABSTRACT

The present invention provides for compensation of leakage charge in a PLL. A first plurality and second plurality of charge pumps has a source charge pump and a sink charge pump, and each charge pump has its own switch. A first node is coupled between at least one source charge pump and at least one sink charge pump. A second node coupled between at least one source charge pump and at least one sink charge pump. A PLL filter is coupled to the first node. A dummy filter is coupled to the second node. A first input of a differential mode sensor is coupled to the PLL filter. A second input of a differential mode sensor is coupled to the dummy filter. A first input of a common mode sensor is coupled to the dummy filter. A second input of a common mode sensor coupled to the PLL filter.

15 Claims, 2 Drawing Sheets

VARIATION TOLERANT CHARGE LEAKAGE CORRECTION CIRCUIT FOR PHASE LOCKED LOOPS

TECHNICAL FIELD

The preset invention relates generally to leakage current correction and, more particularly, to leakage current correction in phase locked loops (PLLs).

BACKGROUND

Phase Locked Loops (PLLs) can be an integral component of systems that use clocking for various operations. These systems can include microprocessors, wireless/wireline transceivers, and other devices known to those of skill in the art. Generally, PLLs are used to generate an output waveform which has a timing relationship with an input waveform, such as a 1:1 ratio, a 2:1 ratio, and so on. For instance, an input waveform of 60 Hertz could be inputted into a PLL to generate an output waveform of 120 Hertz. Furthermore, there would be a predefined phase relationship between the input wave and the output wave.

One important element of a PLL is a low pass filter, which typically comprises passive elements, such as capacitors and resistors. In a PLL, the voltage on the LPF is used as an input signal to a voltage controlled oscillator (VCO). Therefore, the voltage on the capacitor should remain stable, so that a stable oscillation occurs within the PLL, thereby leading to a stable output frequency.

Often, metal oxide semiconductors (MOSs) can be used as capacitors within a PLL. For instance, the gate and the source, or the gate and the drain, of a MOS can be used within an integrated circuit as the cathode and anode of a capacitor. However, with the rapid advancement of CMOS technology and the resulting reduction of the gate oxide thickness, a regime is being entered wherein the effect of leakage current through the gate dielectric is a problem.

There are two major regimes pertaining to gate leakage in metal-oxide-semiconductor (MOS) devices. These regimes are the Fowler-Nordheim regime and the direct tunneling regime. In the Fowler-Nordheim tunneling regime, which is dominant for thick (greater the 50 angstrom) oxides, the tunneling is a two-step process. In the first phase, in the presence of a large electric field, carriers at the oxide-semiconductor interface are accelerated. This increases the energy of the carriers (the carriers become hot) such that the barrier they encounter is reduced from trapezoidal to triangular. The tunneling current for the Fowler-Nordheim regime is proportional to the below:

$$I \alpha E_{ox}^2 \exp(-B[1-(1-qV_{ox}/C)^{1.5}/E_{ox})$$

wherein $E_{ox}$ is the electric field strength across the gate oxide/dielectric, which is dependent on the potential ($V_{ox}$) across the MOS capacitor, and B is a constant.

In the direct tunneling regime, the oxide is thin enough for carriers to directly tunnel across the trapezoidal barrier. The current in the direct tunnel regime is proportional to the following equation:

$$I \alpha E_{ox}^2 \exp(-B[1-(1-qV_{ox}/C)^{1.5}/E_{ox})$$

wherein $E_{ox}$ is the electric field across the gate oxide/dielectric, q is the electric change in coulombs, $V_{ox}$ is the voltage across the capacitor dielectric, and B and C are constants. In both of the above equations, the leakage current is exponentially dependent on the voltage across the capacitor.

Generally, the leakage current through the capacitor is exponentially dependent upon the voltage across, as well as the thickness of, the gate dielectric. That is, as the thickness of the gate dielectric gets smaller, the leakage current increases exponentially. Also, increasing the voltage across the capacitor will result in an exponential increase in leakage current.

One trend in device technology is for thinner gate dielectrics to help achieve higher performance. However, the penalty for this is the associated exponential increase in leakage current.

In a PLL, the effect of capacitance leakage on PLL performance can be most noticeable when the PLL is in the locked state (that is, there is a determined relationship between the input phase and the output phase of the waveforms) and the capacitor is not being charged by either charge pump, what is otherwise referred to as a high Z state. Suppose, just before the PLL locks, the voltage at Node X in FIG. 1 is set to a voltage value V. Once the PLL is locked, the charge pumps are both disconnected, but for stable operation, the voltage at Node X should also remain stable. However, due to gate leakage of the large MOS device which is used as a capacitor, the voltage at Node X decays to ground with a time constant that is determined by the effective resistance associated with the tunneling current as well as the value of the capacitance. In some cases, the low pass filter cap is not too leaky. In other words, the time duration over which the discharging takes place is large enough that the resulting jitter will have most of its spectral components within the PLL loop bandwidth. As a result, this jitter is not filtered out.

One conventional solution to minimize this effect is to add a resistor in parallel with the low pass filter capacitor between Node X of FIG. 1 and electrical ground. If this added resistor has a value smaller than the effective resistance associated with the tunneling current in the filter capacitor, the resulting jitter at Node X will have its spectrum pushed out to higher frequencies. However, the addition of this resistor reduces the effective dominant pole frequency of the PLL, thereby reducing PLL bandwidth. So, one faces the tradeoff of lowered PLL bandwidth with reduced leakage induced jitter.

In the time domain, this resistor can be considered as making the LPF capacitor more leaky, thereby pushing the center of the spectral distribution of the jitter at Node X to a higher frequency, which can subsequently be filtered out. However, while long-term jitter is filtered out, the output of the VCO can suffer from substantial cycle-to-cycle jitter.

Therefore, there is a need to minimize jitter due to leaky filter capacitors that avoids at least some of the trade offs between loop bandwidth and jitter suppression.

SUMMARY OF THE INVENTION

The present invention provides for compensation of leakage charge in a phased locked loop. A first plurality of charge pumps has a source charge pump and a sink charge pump, and each charge pump has its own switch. A second plurality of charge pumps has a source charge pump and a sink charge pump, and each charge pump has its own switch. A first node is coupled between at least one source charge pump and at least one sink charge pump. A second node coupled between at least one source charge pump and at least one sink charge pump. A phase lock loop filter is coupled to the first node. A dummy filter is coupled to the second node. A first input of a differential mode sensor is coupled to the phase lock loop filter. A second input of a differential mode sensor is coupled to the dummy filter. A first input of a common mode sensor is coupled to the dummy filter. A second input of a common mode sensor coupled to the phase locked loop filter.

BRIEF DESCRIPTION OF THE DRAWINGS

For a more complete understanding of the present invention, and the advantages thereof, reference is now made to the following Detailed Description taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

In the remainder of this description, a processing unit (PU) may be a sole processor of computations in a device. In such a situation, the PU is typically referred to as an MPU (main processing unit). The processing unit may also be one of many processing units that share the computational load according to some methodology or algorithm developed for a given computational device. For the remainder of this description, all references to processors shall use the term MPU whether the MPU is the sole computational element in the device or whether the MPU is sharing the computational element with other MPUs, unless otherwise indicated.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1:
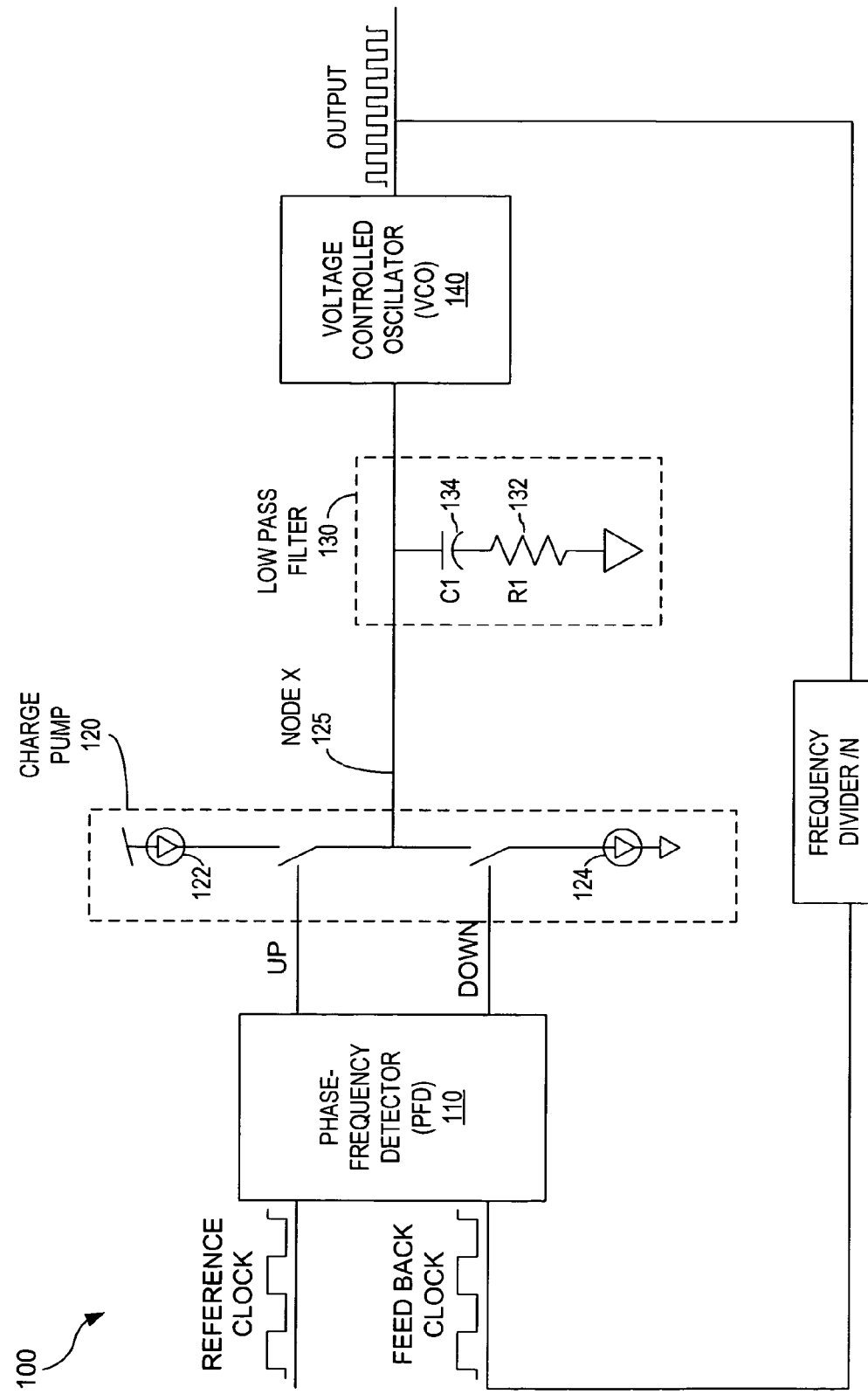
FIG. 1 schematically depicts a conventional phase locked loop circuit.

Turning to FIG. 1, disclosed is a conventional PLL circuit 100. Turning now to FIG. 1, illustrated is a PLL 100. A phase-frequency detector (PFD) 110 is coupled to a charge pump 120. The charge pump 120 has a current source 122 and current sink 124. The PFD 110 compares the difference between phases of a reference clock frequency and the feedback clock frequency to thereby generate signals to charge the capacitor 134 of the low pass filter 130 through use of the current source 122 or the current sink 124. The voltage on the anode of capacitor 134 is then applied to a voltage controlled oscillator (VCO) 140. The VCO generates an oscillatory output signal at a given frequency as a function of the capacitor 134 voltage. The output of the VCO 140 is then divided in a frequency divider /n 150, and fed back into the PFD 110.

However, should the charge pumps 120 be turned into the off condition by the PFD 110, there is no replacement of charge at the capacitor 134, as it continues to drain through a resistor 132. Therefore, there would be drift of voltage by the capacitor 134 as charge leaks out of the capacitor 134, which then changes the signal output frequency of the VCO. This changed output is then fed back into the PFD 110, after the frequency divider 150 has processed the changed signal. The PFD 110 would then alter its output to compensate for this change. This drift of output signal of the VCO 140 could lead to an undesirable oscillation of the output frequency signal.

Figure 2:
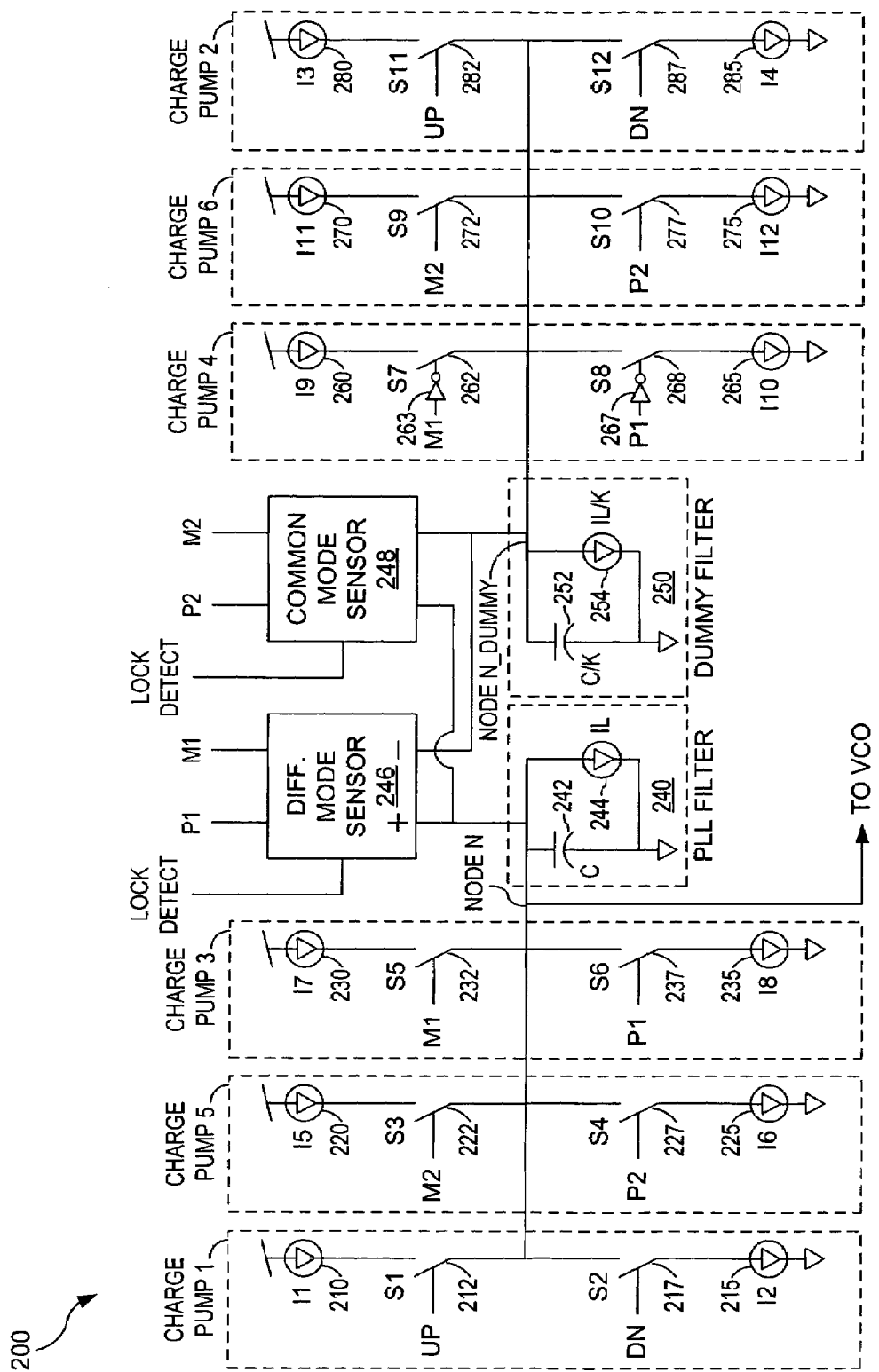
FIG. 2 schematically illustrates a low pass filter of a PLL circuit wherein the leakage current of the low pass filter is compensated for employment of a differential mode sensor and a command mode sensor.

Turning now to FIG. 2, illustrated is a leakage current detection circuit 200 for employment with a PLL. Generally, one advantage of having a dummy filter with an I/K leakage current is that differential amplifiers have differential inputs. The dummy filter is scaled down so that it does not occupy a large area, and can be used to control replacement leakage current. Generally, the dummy filter is used to generate voltage at the second inputs of the common mode and differential mode amplifiers. Generally, use of the dummy filter 250 avoids a additional circuitry to measure the voltage, to store the measurement somewhere, apply the feedback and so on. The PLL filter generates the voltages at the first inputs of the differential mode and common mode amplifiers.

In the circuit 200, charge pump 1 has a current source I1 210 and a current sink I2 215. The charge pump 1 also has two switches, switch S1 212 coupled to the current source 210, and switch S2 217, coupled to the current drain I2 215. Charge pump 1 is also coupled to a common node, node N, that is coupled to the anode of a PLL filter 240.

Charge pump 5 has a current source I5 220 and a current sink I6 225. The charge pump 5 also has two switches, switch S3 222 coupled to the current source 220, and switch S4 227, coupled to the current drain I6 225. Charge pump 5 is also coupled to the common node, node N, that is coupled to the anode of the PLL filter 240.

Charge pump 3 has a current source I7 230 and a current sink I8 235. The charge pump 3 also has two switches, switch S5 232 coupled to the current source 230, and switch S6 237, coupled to the current drain I8 235. Charge pump 3 is also coupled to the common node, node N, that is coupled to the anode of the PLL filter 240. The common node is also coupled to a voltage controlled oscillator (not illustrated) of a PLL.

The PLL Filter 240 has a capacitor 242 coupled to the common node, node N, and to ground. The leakage current through the PLL filter 240 is modeled as IL (leakage current) 244, which also coupled to ground.

Node N of the PLL filter is also coupled to the non-inverting input of a differential mode sensor 246. This block has two complementary outputs called P1 and M1. P1 and M1 in turn drive two sets of charge pumps called Charge Pump 3 and Charge Pump 4, respectively.

The differential mode sensor 246 is controlled by the output of the lock detector labeled lock detect. Only after the PLL has achieved lock is the differential mode sensor allowed to become active. The P1 output is coupled to switch S6 237 and S8 268. The M1 output is coupled to switch S5 232 and S7 262. The differential mode sensor 246 is essentially a high open loop gain (>80 db) operational amplifier.

The leakage compensating circuit also has a circuit block called Common Mode Sensor 248. This also has two complementary outputs called P2 and M2. These drive two sets of charge pump circuits called charge pump 5 and charge pump 6 respectively. Node N of the PLL filter is also coupled to the input of the common mode sensor 248. The common mode sensor 248 is controlled by the output of the lock detector labeled lock detect. Only after the PLL has achieved lock is the common mode sensor allowed to become active.

The common mode sensor 248 also has two outputs, a P2 output and an M2 output. The P2 output is coupled to switch S4 227 and S10 277. The M2 output is coupled to switch S9 272 and S3 222. Generally, the differential mode amplifier senses any differential voltage mismatch between NODE N and NODE N_DUMMY. It will try to eliminate this differential voltage by adjusting the voltages at nodes P1 and M1. The common mode amplifier senses any common voltage mismatch between NODE N and NODE N_DUMMY. It will try to eliminate this common voltage drift by adjusting the voltages at node P2 and M2.

The inverting node of the differential node sensor 246 and a second input of the common mode sensor 248 are coupled to a node N_dummy. The node N_dummy is the anode of a dummy PLL filter 250. The dummy PLL filter 250 has a capacitor 252 coupled to ground, and also has a modeled leakage current 254. The capacitance of capacitor 252 is of the magnitude of C 242, divided by a known constant, K. Likewise, the modeled leakage current 254 is of the magnitude of I1 244, divided by the known constant, K. Dummy filter 250 is a scaled down replica of PLL filter 240. This reduces the area consumed by the capacitor in the dummy filter 250. The ratio of the capacitors in PLL filter 240 to dummy filter 250 is equal to K.

PLL filter 240 and dummy filter 250 have associated charge pumps with them called Charge Pump 1 and Charge Pump 2, respectively. Charge pump 1 consists of currents I1 and I2. Charge pump 2 consists of currents I3 and I4. Ideally, I1 /I3=I2/I4=K, and I1=I2.

Charge pump 2 has a current source I3 280 and a current sink I4 285. The charge pump 2 also has two switches, switch S11 282 coupled to the current source 280, and switch S12 287, coupled to the current source I4 285. Charge pump 2 is also coupled to a common node, node N_dummy that is coupled to the anode of the dummy filter 250.

Charge pump 6 has a current source I11 270 and a current sink I12 275. The charge pump 6 also has two switches, switch S9 272 coupled to the current source 270, and switch S10 277, coupled to the current sink I12 275. Charge pump 6 is also coupled to the common node, node N dummy, that is coupled to the anode of the dummy filter 250.

Charge pump 4 has a current source I9 260 and a current sink I10 265. The charge pump 4 also has two switches, switch S7 262 coupled to the current source 260, and switch S8 268, coupled to the current source I10 265. The control input to switch S7 262 is inverted by an inverter 263. The control input to switch S8 268 is inverted by an inverter 267. Charge pump 4 is also coupled to the common node, node N_dummy, that is coupled to the anode of the dummy filter 250.

Generally, in the circuit 200, prior to achieving a stable phase/frequency lock in a PLL, the lock detect node in FIG. 2 is in such a state that the Differential Mode Sensor 246 and Common Mode Sensor 248 are disabled. This also disables charge pumps 3, 4, 5, and 6.

Therefore, when a PLL is trying to get a lock, only charge pumps 1 and 2 are active. In the system 200, Charge Pump 1 is driving PLL Filter 240, and Charge Pump 2 is driving Dummy Filter 250. The filters have capacitors 242, 252, respectively. The charge leakage, 244 and 254, associated with the capacitors is modeled as a voltage dependent current source called IL and IL/K, respectively. To reiterate the above, the capacitor 252 in Dummy Filter 250 is K times smaller than that in PLL Filter 240. Hence, the leakage current 254 is also K times smaller. Furthermore, the charge pump currents in Charge Pump 2 are K times smaller than their counterparts in Charge Pump 1. Charge pump 1 and 2 are driven by the same signals (UP and DN) coming from a phase frequency detector (PFD, not shown). Therefore, barring any mismatches, the voltages at node N and node N_dummy (look at FIG. 2) will be identical when the PLL is trying to achieve a lock. Once the PLL achieves lock Differential Mode Sensor 246 and Common Mode Sensor 248 are enabled to start the process of compensating for filter capacitor charge leakage of the C 242 of the PLL filter 240.

In idealized scenarios, all components will meet design specifications. Hence, one would not generally have to consider effects arising from process variations. In this idealized case, node N and node N_dummy will have identical values. The lack of differential inputs into Differential Mode Sensor will effectively disable this component. In reality, there will always exist some margin of error in the process of fabrication. This finite mismatch will ultimately translate into differences between the voltages at node N and node N_dummy. In this case Differential Mode Sensor 246 will act to bring node N and node N_dummy to the same potential.

For example, if the voltage at node N is larger than that at node N_dummy, then P1 will be high and M1 will be low. This in turn will enable switches S6 and S7. Hence charge will be extracted from node N (there by pulling its potential lower) and added to node N_dummy (thereby raising its potential). If the voltage at node N is lower than that at node N_dummy, then P1 will be low and M1 will be high. This in turn will enable switches S5 232 and S8 268. Hence, charges will be extracted from node N_dummy (there by pulling its potential lower), while charge is add to node N (pulling its potential higher). The process will continue until the potentials at node N and node_N dummy are substantially identical.

Typically, the open loop gain of Differential Mode Sensor 246 is extremely large. The closed loop response, that is, when feedback is enabled, is such that node N and node N_dummy will have almost identical potentials. As mentioned earlier, one cause of the potential mismatch between node N and node N_dummy is process mismatch. Therefore, Differential Mode Sensor also acts to compensate for process mismatches.

While providing the above mentioned benefits, Differential Mode Sensor 246 suffers from one important drawback. That is, it cannot detect common mode fluctuations. Differential Mode Sensor will ensure that the potentials at node N and node N_dummy will be identical. However, it will not correct if both node N and node N_dummy start to increase/decrease while maintaining no differential signals between them.

To compensate for this, a Common Mode Sensor 248 is employed. The Common Mode Sensor 248 essentially operates as a differentiator. When the common mode voltage at node N and node N_dummy both start to increase, node P2 of Common Mode Sensor 248 is high and node M2 is low. This enables switches S4 and S10. Enabling switches S4 and s10 extracts charges from node N and node N_dummy, thereby, reducing the common mode voltage. When the common mode voltage at node N and node N_dummy both start to decrease, node M2 of Common Mode Sensor 248 is high and node P2 is low. This enables switches S3 and S9. Enabling switches S3 and S9 adds charges to node N and node N_dummy, thereby, increasing the common mode voltage. To conclude, the combination of Differential Mode Sensor and Common Mode Sensor coupled with their respective charge pumps compensates for the filter charge leakage enabling the filter capacitor to hold its locked state potential.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A circuit for compensating for leakage charge in a Phase Locked Loop, comprising:
    a first plurality of charge pumps, wherein each charge pump comprises a source charge pump and a sink charge pump, and each charge pump has its own switch;
    a second plurality of charge pumps, wherein each charge pump comprises a source charge pump and a sink charge pump, and each charge pump has its own switch;
    a first node coupled between at least one source charge pump and at least one sink source pump;
    a second node coupled between at least one source charge pump and at least one sink source pump;
    a phase lock loop filter coupled to the first node;
    a dummy filter coupled to the second node;
    a first input of a differential mode sensor coupled to the phase lock loop filter;
    a second input of the differential mode sensor coupled to the dummy filter;
    a first input of a common mode sensor coupled to the dummy filter; and
    a second input of the common mode sensor coupled to the phase locked loop filter.

2. The PLL of claim 1, wherein the first input of the differential mode sensor is a non-inverting input.

3. The PLL of claim 1, wherein the second input of the differential mode sensor is an inverting input.

4. The PLL of claim 1, wherein the first plurality of charge pumps comprises three charge pumps.

5. The PLL of claim 1, wherein the second plurality of charge pumps comprises three charge pumps.

6. The PLL of claim 1, wherein an output of the differential mode sensor is coupled to at least one current sink of the first plurality of charge pumps.

7. The PLL of claim 1, wherein an output of the differential mode sensor is coupled to at least one current source of the second plurality of charge pumps.

8. The PLL of claim 1, wherein an output of the differential mode sensor is coupled to at least one current source of the first plurality of charge pumps.

9. The PLL of claim 1, wherein an output of the differential mode sensor is coupled to at least one current sink of the second plurality of charge pumps.

10. The PLL of claim 1, wherein an output of the common mode sensor is coupled to at least one current sink of the first plurality of charge pumps.

11. The PLL of claim 1, wherein an output of the common mode sensor is coupled to at least one current source of the second plurality of charge pumps.

12. The PLL of claim 1, wherein an output of the common mode sensor is coupled to at least one current source of the first plurality of charge pumps.

13. The PLL of claim 1, wherein an output of the common mode sensor is coupled to at least one current sink of the second plurality of charge pumps.

14. The PLL of claim 1, wherein there is a given proportion between a leakage current of the PLL filter and a leakage current of the dummy filter.

15. The PLL of claim 14, wherein the capacitance of a capacitor of the PLL filter is proportional to the capacitance of a capacitor of the dummy filter is substantially the same as the given proportion between a leakage current of the PLL filter and a leakage current of the dummy filter.

* * * * *